United States Patent
Koh et al.

(10) Patent No.: US 7,745,325 B2
(45) Date of Patent: Jun. 29, 2010

(54) WIRING STRUCTURE OF A SEMICONDUCTOR DEVICE, METHOD OF FORMING THE WIRING STRUCTURE, NON-VOLATILE MEMORY DEVICE INCLUDING THE WIRING STRUCTURE, AND METHOD OF MANUFACTURING THE NON-VOLATILE MEMORY DEVICE

(75) Inventors: Young-Ho Koh, Yongin-si (KR); Byung-Hong Chung, Seoul (KR); Won-Jin Kim, Suwon-si (KR); Hyun Park, Hwaseong-si (KR); Ji-Young Min, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 103 days.

(21) Appl. No.: 11/798,715

(22) Filed: May 16, 2007

(65) Prior Publication Data

US 2008/0017889 A1    Jan. 24, 2008

(30) Foreign Application Priority Data

Jul. 18, 2006  (KR) ............... 10-2006-0066877

(51) Int. Cl.
    *H01L 21/00* (2006.01)
(52) U.S. Cl. ............ 438/622; 438/623; 438/628; 438/631; 438/634; 438/637; 257/E21.257; 257/E21.579; 257/E21.585; 257/E23.019

(58) Field of Classification Search ........... 438/622, 438/623, 628, 631, 633, 634, 637, 700, 940, 438/945; 257/E21.257, 579, 585, E23.019
See application file for complete search history.

(56) References Cited

U.S. PATENT DOCUMENTS

| 5,091,339 | A | * | 2/1992 | Carey .................... 216/18 |
| 5,352,923 | A | * | 10/1994 | Boyd et al. ............. 257/536 |
| 5,989,623 | A | * | 11/1999 | Chen et al. ............ 427/96.8 |
| 6,017,817 | A | * | 1/2000 | Chung et al. .......... 438/637 |
| 6,074,959 | A | * | 6/2000 | Wang et al. ........... 438/738 |
| 6,617,232 | B2 | * | 9/2003 | Kim et al. ............. 438/597 |
| 2004/0262674 | A1 | * | 12/2004 | Shimizu ................ 257/324 |
| 2005/0051831 | A1 | | 3/2005 | Kajimoto et al. |

FOREIGN PATENT DOCUMENTS

| JP | 11-340161 | 12/1999 |
| JP | 2005-038884 | 2/2005 |
| KR | 10-0242434 B1 | 11/1999 |
| KR | 10-2003-0068776 | 8/2003 |
| KR | 10-2004-0033774 | 4/2004 |
| KR | 10-2005-0073043 A | 7/2005 |

* cited by examiner

*Primary Examiner*—Michael S Lebentritt
(74) *Attorney, Agent, or Firm*—Lee & Morse, P.C.

(57) ABSTRACT

A wiring structure of a semiconductor device may include an insulation interlayer on a substrate, the insulation interlayer having a linear first trench having a first width and a linear second trench having a second width, the linear second trench being in communication with a lower portion of the linear first trench, the first width being wider than the second width, and a conductive layer pattern in the linear first and second trenches.

6 Claims, 16 Drawing Sheets

WIRING STRUCTURE OF A SEMICONDUCTOR DEVICE, METHOD OF FORMING THE WIRING STRUCTURE, NON-VOLATILE MEMORY DEVICE INCLUDING THE WIRING STRUCTURE, AND METHOD OF MANUFACTURING THE NON-VOLATILE MEMORY DEVICE

BACKGROUND OF THE INVENTION

1. Field of the Invention

Exemplary embodiments of the present invention relate to wiring structures of a semiconductor device, methods of forming such wiring structures, non-volatile memory devices including such a wiring structure, and methods of manufacturing such a non-volatile memory device. More particularly, exemplary embodiments of the present invention relate to wiring structures of a semiconductor device that has an increased contact margin with respect to a contact plug on the wiring structure, methods of forming the wiring structure, non-volatile memory devices including such a wiring structure, and methods of manufacturing such a non-volatile memory device.

2. Description of the Related Art

Generally, memory devices may be classified as volatile memory devices or non-volatile memory devices based on whether the memory devices stores or removes data when current is not provided to the memory device. Examples of volatile memory devices may include erasable programmable read only memory (EPROM) devices, electrically EPROM (EEPROM) devices, flash memory devices, etc. Merits of EPROM and EEPROM are embedded in the flash memory. That is, the flash memory generally uses a process substantially the same as that of the EPROM when data is programmed and the flash memory generally uses a process substantially the same as that of the EEPROM when the data is erased. Further, the flash memory generally has a smaller chip size than those of the EPROM and the EEPROM, and thus, the flash memory may have a higher capacity. Furthermore, information in the flash memory may be immediately renewed through a system.

Flash memories may be classified as a NOR type flash memory or a NAND type flash memory in accordance with constitutions of a cell. A memory cell of the NAND type flash memory may include cell strings in a cell array to which, e.g., sixteen or thirty-two cell transistors are connected. A string selection transistor for selecting strings may be connected to one end of each of the cell strings. Further, a ground selection transistor may be connected to the other end of each of the cell strings.

Gate electrodes of each of the string selection transistors may be connected to each other. The gate electrodes of the string selection transistors may serve as a string selection line (SSL). Further, gate electrodes of each of the ground selection transistors may be connected to each other. The gate electrodes of the ground selection transistors may serve as a ground selection line (GSL).

A common source line may be electrically connected to source regions of the ground selection transistors. The common source line may extend in a direction substantially perpendicular to an extending direction of the cell strings. Further, a contact plug and a bit line may be formed on the common source line so that the contact plug and the bit line may be electrically connected to the common source line.

In the above-mentioned memory cell of the NAND type flash memory, the contact plug must be accurately formed on the common source line. Thus, a process for forming a contact hole may be carried out in advance to precisely expose an upper surface of the common source line through the contact hole.

However, when the contact hole is misaligned during, e.g., a photolithography process for forming the contact hole, the common source line may not be exposed through the misaligned contact hole so that an insulation interlayer on a sidewall of the common source line may be etched. Further, the misaligned contact hole may partially expose an upper surface of a semiconductor substrate adjacent to the common source line. As a result, a short between the contact plug in the misaligned contact hole and, e.g., the exposed upper surface of the semiconductor substrate or a gate of an adjacent transistor may be generated.

SUMMARY OF THE INVENTION

The present invention is therefore directed to wiring structures of a semiconductor device, methods of forming such a wiring structure, non-volatile memory devices including such a wiring structure, and methods of manufacturing such non-volatile memory devices, which substantially overcome one or more of the problems due to the limitations and disadvantages of the related art.

It is therefore a feature of an embodiment of the present invention to provide a wiring structure having an increased contact margin with respect to a contact plug on the wiring structure.

It is therefore a separate feature of an embodiment of the present invention to provide a method of forming a wiring structure having an increased contact margin with respect to a contact plug on the wiring structure.

It is therefore a separate feature of an embodiment of the present invention to provide a non-volatile memory device including a wiring structure that has an increased contact margin with respect to a contact plug on the wiring structure.

It is therefore a separate feature of an embodiment of the present invention to provide a method of manufacturing a non-volatile memory device including a wiring structure that has an increased contact margin with respect to a contact plug on the wiring structure.

At least one of the above and other features and advantages of the present invention may be realized by providing a wiring structure of a semiconductor device, including an insulation interlayer formed on a substrate, the insulation interlayer having a linear first trench and a linear second trench that is in communication with a lower portion of the first trench, and the first trench having a first width that is wider than a second width of the second trench, and a conductive layer pattern formed in the first and second trenches.

The linear first trench may have an upper width and a lower width narrower than the upper width, the lower width may be wider than the second width. The wiring structure may further include an upper insulation interlayer on the insulation interlayer and the conductive layer pattern, and a contact plug in the upper insulation interlayer that contacts an upper surface of the conductive layer pattern. The linear first trench may have an upper portion and a lower portion, and a width of the lower portion may gradually decrease between the upper portion of the linear first trench and the linear second trench.

At least one of the above and other features and advantages of the present invention may be separately realized by providing a method of forming a wiring structure of a semiconductor device, including forming an insulation interlayer on a substrate, the insulation interlayer having a linear first trench and a linear second trench that is in communication with a lower portion of the linear first trench, and the linear first trench having a first width that is wider than a second width of the linear second trench, and filling the linear first and second trenches with a conductive layer pattern.

Forming the insulation interlayer having the linear first and second trenches may include forming a preliminary insulation interlayer on the substrate, partially etching the preliminary insulation interlayer to form the linear first trench having the first width, and partially etching the preliminary insulation interlayer exposed through the linear first trench to form the linear second trench having the second width.

Forming the linear first trench may include forming a mask pattern on the preliminary insulation interlayer, anisotropically etching the preliminary insulation interlayer using the mask pattern as an etching mask to form a preliminary first trench, and isotropically etching the preliminary insulation interlayer exposed through the preliminary first trench to form the linear first trench having the first width.

Partially etching the preliminary insulation interlayer for forming the linear second trench may include an anisotropic etching process. The method of forming a wiring structure may further include forming an upper insulation interlayer on the insulation interlayer and the conductive layer pattern, partially etching the upper insulation interlayer to form a contact hole exposing an upper surface of the conductive layer pattern, and filling the contact hole with a conductive material to form a contact plug contacting the upper surface of the conductive layer pattern.

At least one of the above and other features and advantages of the present invention may be separately realized by providing a non-volatile memory device, including a cell string on a substrate, the cell string including cell transistors that are arranged in a first direction, a string selection transistor arranged at a first end of the cell string, a ground selection transistor arranged at a second end of the cell string that is opposite to the first end, a first insulation interlayer covering the cell string, the string selection transistor and the ground selection transistor, the first insulation interlayer having a linear trench structure that exposes an upper surface of the substrate corresponding to a common source region at a side of the ground selection transistor and extends in a second direction substantially perpendicular to the first direction, and the linear trench structure having a first trench having a first width and a second trench having a second with, the second trench being in communication with a lower portion of the first trench and the second width being narrower than the first width, a common source line in the trench structure, the common source line having an upper width and a lower width narrower than the upper width, a second insulation interlayer on the first insulation interlayer and the common source line, the second insulation interlayer having a contact hole that partially exposes an upper surface of the common source line, and a contact plug in the contact hole.

The non-volatile memory device may further include a wiring line on the second insulation interlayer and the contact plug, the wiring line being electrically connected to the contact plug. The common source line and the contact plug may include a metal.

At least one of the above and other features and advantages of the present invention may be separately realized by providing a method of manufacturing a non-volatile memory device, including forming a cell string on a substrate, the cell string including cell transistors arranged in a first direction, forming a string selection transistor and a ground selection transistor at both ends of the cell string, respectively, covering the cell string, the string selection transistor and the ground selection transistor with a first insulation interlayer, the first insulation interlayer having a linear trench structure that exposes an upper surface of the substrate corresponding to a common source region at a side of the ground selection transistor and extends in a second direction substantially perpendicular to the first direction, and the linear trench structure having a first trench that has a first width and a second trench that is in communication with a lower portion of the first trench and has a second width narrower than the first width, forming a common source line in the linear trench structure, the common source line having an upper width and a lower width narrower than the upper width, forming a second insulation interlayer on the first insulation interlayer and the common source line, the second insulation interlayer having a contact hole that partially exposes an upper surface of the common source line, and forming a contact plug in the contact hole.

Forming the first insulation interlayer having the linear trench structure may include forming a preliminary first insulation interlayer on the substrate to cover the cell string, the string selection transistor and the ground selection transistor, partially etching the preliminary first insulation interlayer to form the first trench having the first width, and partially etching the preliminary first insulation interlayer exposed through the first trench to form the second trench having the second width.

Forming the first trench may include forming a mask pattern on the preliminary first insulation interlayer, anisotropically etching the preliminary first insulation interlayer using the mask pattern as an etching mask to form a preliminary first trench, and isotropically etching the preliminary first insulation interlayer exposed through the preliminary first trench to form the linear first trench having the first width.

Forming the mask pattern may include sequentially forming an amorphous carbon layer, a buffer layer, an organic anti-reflective layer and a photoresist film on the preliminary first insulation interlayer, patterning the photoresist film to form a photoresist pattern, and etching the organic anti-reflective layer, the buffer layer and the amorphous carbon layer using the photoresist pattern as an etching mask.

Partially etching the preliminary first insulation interlayer for forming the linear second trench may include an anisotropic etching process. The common source line and the contact plug may include a metal.

The method of manufacturing a non-volatile memory device may further include forming a wiring line on the second insulation interlayer and the contact plug, the wiring line being electrically connected to the contact plug.

Isotropically etching the preliminary first insulation interlayer may include partially etching the preliminary first insulation interlayer exposed through a sidewall and a bottom surface of the preliminary first trench

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
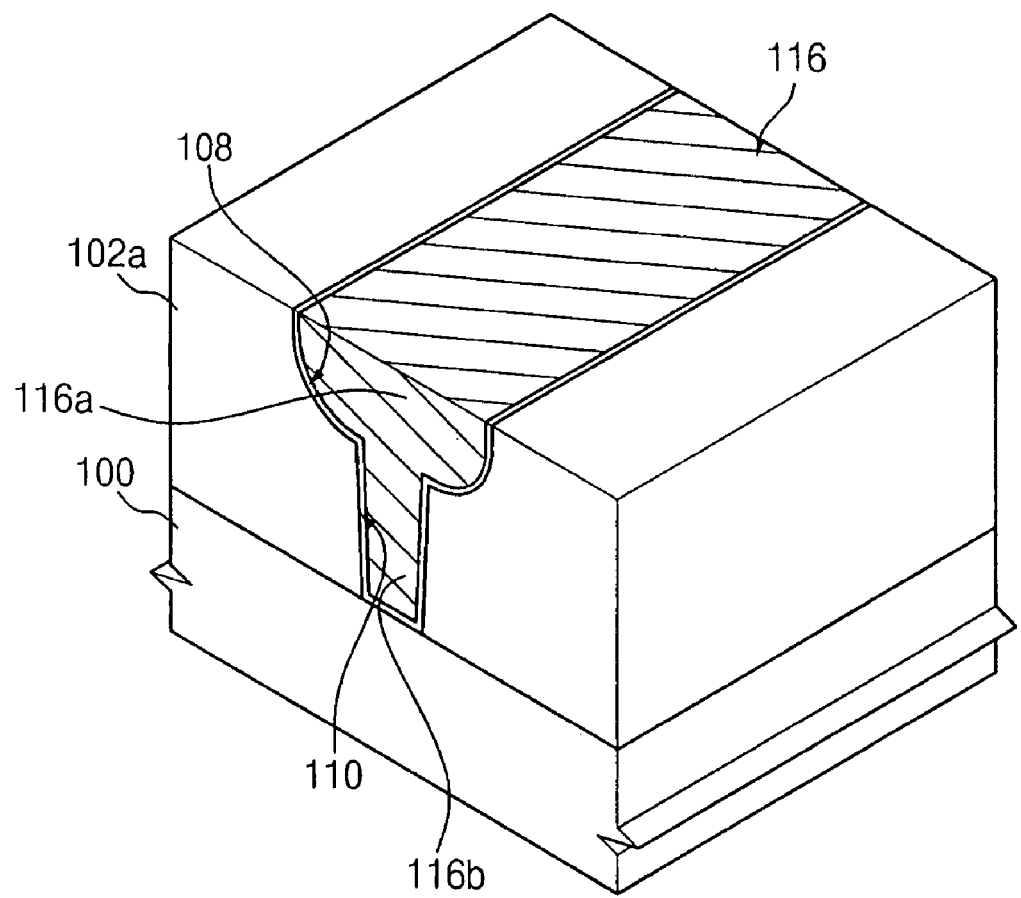
FIG. 1 illustrates a perspective view of a wiring structure according to a first exemplary embodiment of the present invention.

Korean Patent Application No. 2006-66877, filed on Jul. 18, 2006, in the Korean Intellectual Property Office, and entitled: "Wiring Structure of a Semiconductor Device, Method of Forming the Wiring Structure, Non-Volatile Memory Device Including the Wiring Structure, and Method of Manufacturing the Non-Volatile Memory Device," is incorporated by reference herein in its entirety.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

FIG. 1 illustrates a perspective view of a wiring structure according to a first exemplary embodiment of the present invention.

Referring to FIG. 1, an insulation interlayer 102a may be formed on a semiconductor substrate 100. The insulation interlayer 102a may include, e.g., silicon oxide. More particularly, e.g., the insulation interlayer 102a may include high-density plasma (HDP) oxide, borophosphor silicate glass (BPSG), etc.

A first trench 108 and a second trench 110 may be formed through the insulation interlayer 102a. The second trench 110 may be in communication with a lower portion of the first trench 108. The first trench 108 may have a first width. The second trench 110 may have a second width that is narrower than the first width of the first trench 108. More particularly, the first trench 108 may have a substantially U-like shape, and a base of the U-like shape may be in communication with the second trench 110. Further, the first trench 108 may have an upper portion having a first upper width and a lower portion having a first lower width, and the first lower width may be less than the first upper width. More particularly, e.g., at least the lower portion of the first trench 108 may have curved, e.g., rounded, sides, and thus, at least the first lower width of the first trench 108 may gradually decrease toward the second trench 110. Thus, at least an average width of the upper portion of the first trench 108 may be wider than an average width of the lower portion of the first trench 108. Embodiments of the invention are not limited thereto. For example, in some embodiments, the first upper width may also gradually decrease toward the lower portion of the first trench 108.

As shown in FIG. 1, the first and second trenches 108, 110 may together extend from a first side of the insulation interlayer 102a to a second side of the insulation interlayer 102a opposite to the first side. An upper surface of the semiconductor substrate 100 may be exposed through a bottom surface of the second trench 110. The first and second trenches 108 and 110 may have a substantially linear shape extending in a first direction.

The first and second trenches 108 and 110 may be filled with a conductive layer pattern 116, e.g., a linear conductive layer pattern. The conductive layer pattern 116 may include, e.g., a metal, a semiconductor material doped with impurities, etc. In some embodiments of the invention, the conductive layer pattern 116 may have low resistance, and may include, e.g., metal. More particularly, the conductive layer pattern may include, e.g., a barrier metal layer including a titanium/titanium nitride layer, and a tungsten layer stacked on the barrier metal layer.

Because the conductive layer pattern 116 may be formed in the first and second trenches 108 and 110, the conductive layer pattern 116 may have a sidewall profile that substantially corresponds to sidewalls of the first and second trenches 108 and 110. Thus, in some embodiments of the invention, such as the exemplary embodiment illustrated in FIG. 1, the conductive layer pattern 116 may include an upper portion 116a having an upper width and a lower portion 116b having a lower width, and the lower width of the conductive layer pattern 116 may be narrower than the upper width of the conductive layer pattern 116.

An upper insulation interlayer (not shown) may be formed on the insulation interlayer 102a and the conductive layer pattern 116. A contact plug (not shown) that contacts the conductive layer pattern 116 may be formed in the upper insulation interlayer.

According to the exemplary embodiment illustrated in FIG. 1, because the upper width of the conductive layer pattern 116 may be wider than the lower width thereof, the upper portion 116a of the conductive layer pattern 116 may have an area larger than an area of the lower portion 116b of the conductive layer pattern 116. As a result of the larger area of upper portion 116a, a contact margin between the conductive layer pattern 116 and the contact plug may be enlarged.

FIGS. 2 to 5 illustrate cross-sectional views of stages in an exemplary method of forming the wiring structure in FIG. 1 according to one or more aspects of the invention.

Figure 2:
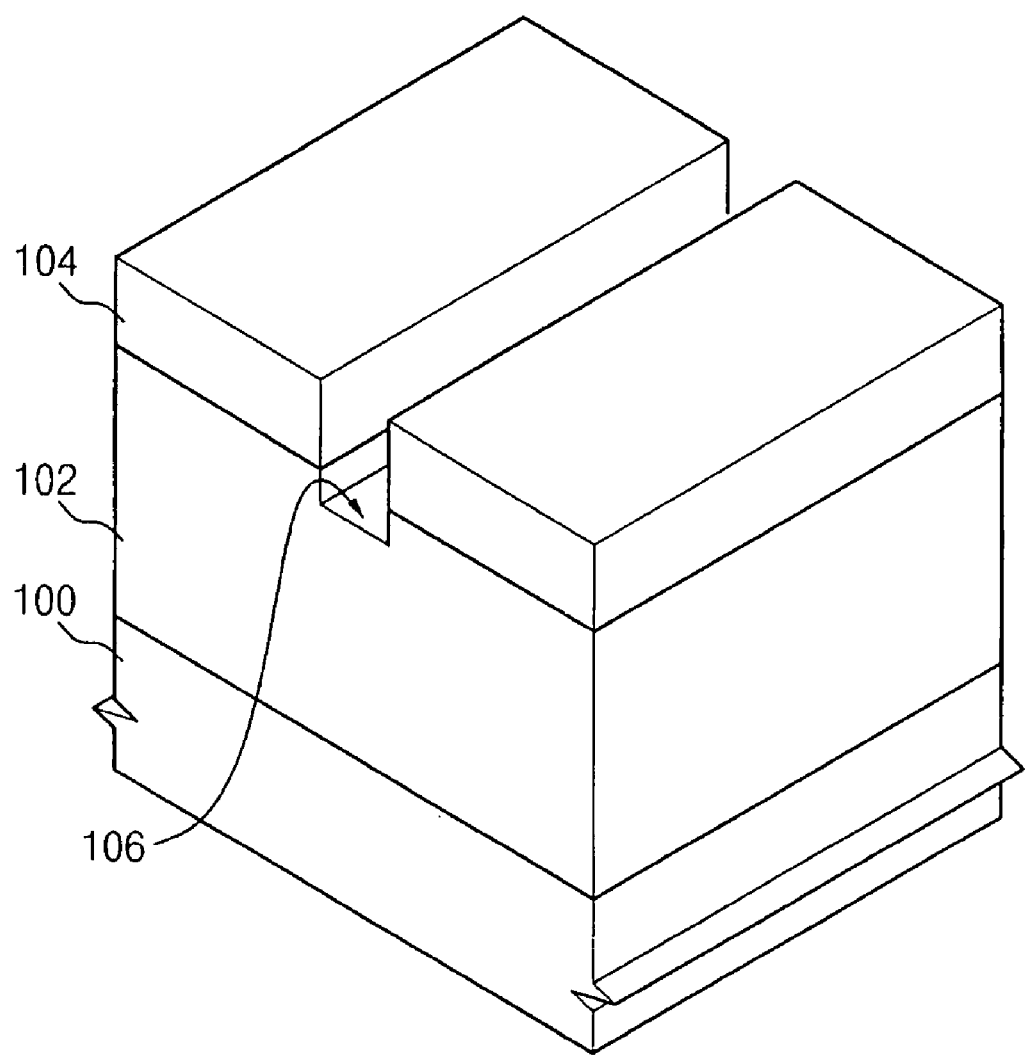
FIGS. 2 to 5 illustrate cross-sectional views of stages in an exemplary method of forming the wiring structure in FIG. 1 according to one or more aspects of the invention.

Referring to FIG. 2, a preliminary insulation interlayer 102 may be formed on the semiconductor substrate 100. The preliminary insulation interlayer 102 may be formed by, e.g., a chemical vapor deposition (CVD) process using silicon oxide. More particularly, e.g., the preliminary insulation interlayer 102 may include HDP oxide, BPSG, etc.

A mask pattern 104 for forming a trench may be formed on the preliminary insulation interlayer 102. The mask pattern 104 may have a substantially linear shape extending in the first direction.

The mask pattern 104 may include, e.g., a photoresist pattern. More particularly, e.g., in some embodiments of the invention, a photoresist film (not shown) may be formed on the preliminary insulation interlayer 102, and the photoresist film may be patterned by an exposure process and a developing process to form the mask pattern 104.

In other embodiments of the invention, the mask pattern 104 may include, e.g., an amorphous carbon layer pattern (not shown), a silicon oxynitride layer pattern (not shown), an anti-reflective layer pattern (not shown) and a photoresist pattern that are sequentially stacked. To form such a mask pattern 104 having the stacked structure, an amorphous carbon layer (not shown), a silicon oxynitride layer (not shown) and an anti-reflective layer (not shown) may be sequentially formed on the preliminary insulation interlayer 102. The photoresist pattern may then formed on the anti-reflective layer, and the amorphous carbon layer, the silicon oxynitride layer and the anti-reflective layer may be etched using the photoresist pattern as an etching mask to form the mask pattern 104 having the stacked structure.

The preliminary insulation interlayer 102 may be anisotropically etched using the mask pattern 104 as an etching mask to form a preliminary first trench 106.

Figure 3:
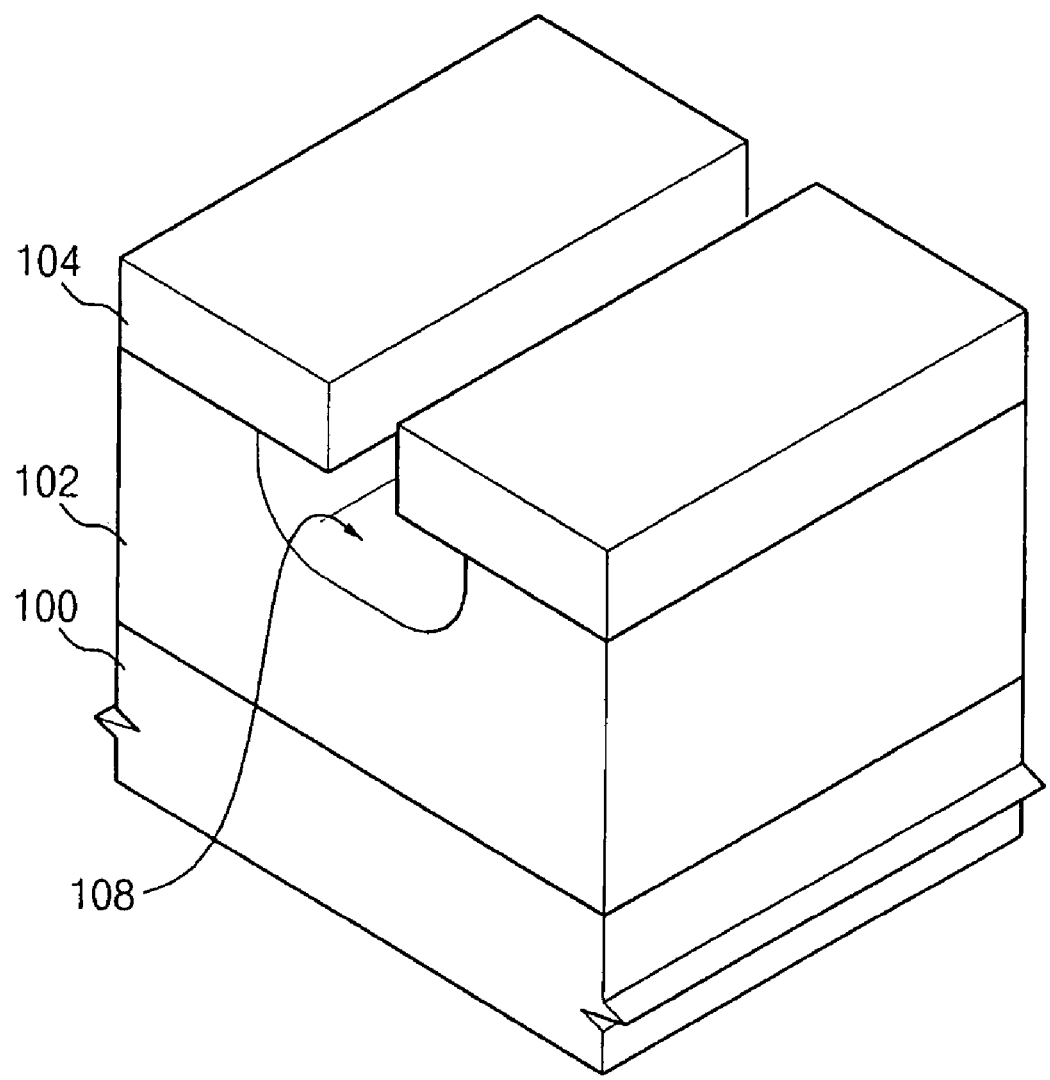

Referring to FIG. 3, a portion of the preliminary insulation interlayer 102, e.g., an exposed portion of the preliminary insulation layer 102 corresponding to a sidewall and a bottom surface of the preliminary first trench 106, may be isotropically etched to form the first trench 108 having the first width that is wider than a width of the preliminary first trench 106.

While the isotropic etching process is carried out, the portion of the preliminary insulation interlayer 102 exposed through the sidewall and the bottom surface of the preliminary first trench 106 may be etched in various directions, e.g., all directions. Thus, as discussed above, in some embodiments of the invention, the first trench 108 may include the upper portion having the first upper width and the lower portion having the first lower width and the first upper width may be wider than the first lower width. More particularly, e.g., at least the lower portion of the first trench 108 may have curved sides, and thus, at least the first lower width of the first trench 108 may gradually decrease toward the second trench 110.

Figure 4:
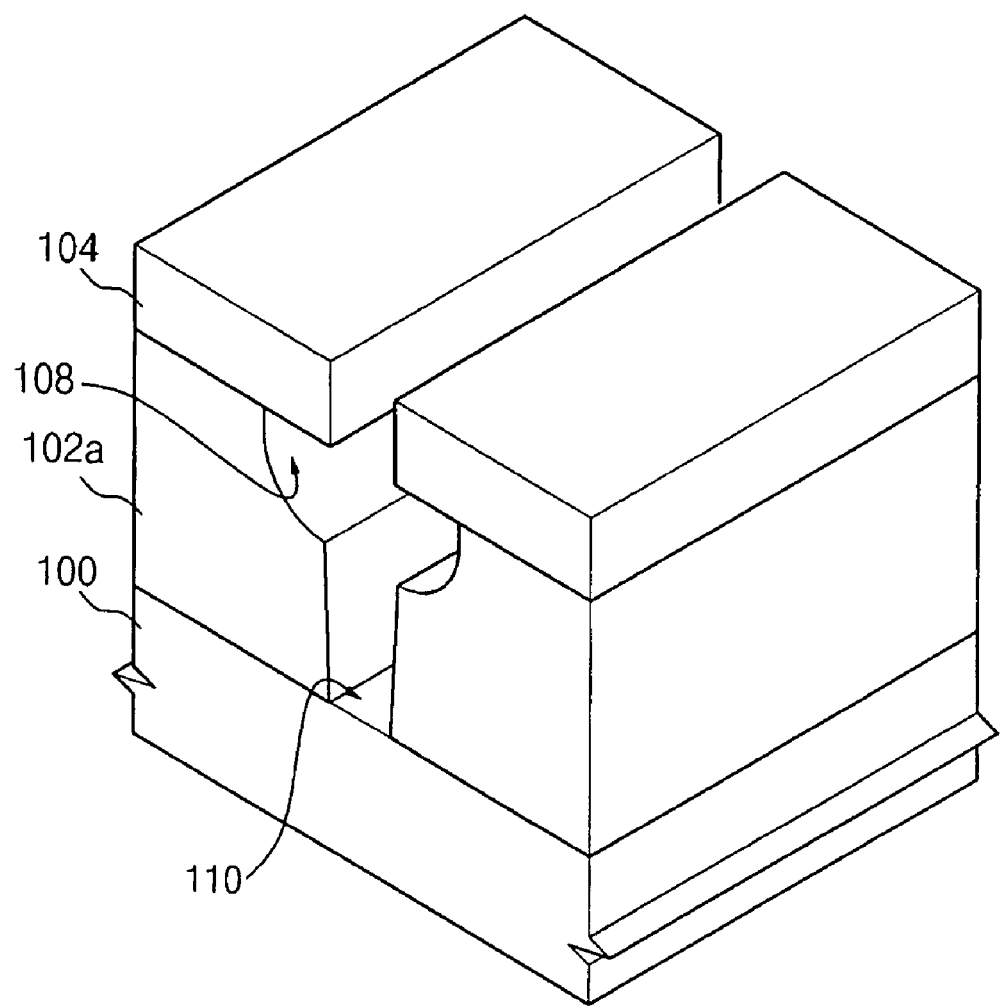

Referring to FIG. 4, a portion of the preliminary insulation interlayer 102, e.g., an exposed portion of the preliminary insulation layer 102 corresponding to a bottom surface of the first trench 108, may then be anisotropically etched using the mask pattern 104 as an etching mask to form the second trench 110 being in communication with the first trench 108. An upper surface of the semiconductor substrate 100 may be exposed through the second trench 110. After the anisotropic etching process is performed, the insulation interlayer 102a having the first and second trenches 108 and 110 may be complete.

In some embodiments of the invention, because the second trench 110 may be formed by the anisotropic etching process using the mask pattern 104 as the etching mask, the second width of the second trench 110 may be substantially the same as or narrower than a width of an opening of the mask pattern 104 exposing the insulation interlayer 102a. As a result, the second width of the second trench 110 may be narrower than the first width of the first trench 108.

After the first and second trenches 108 and 110 are formed through the insulation interlayer 102a, the mask pattern 104 may be removed.

Figure 5:
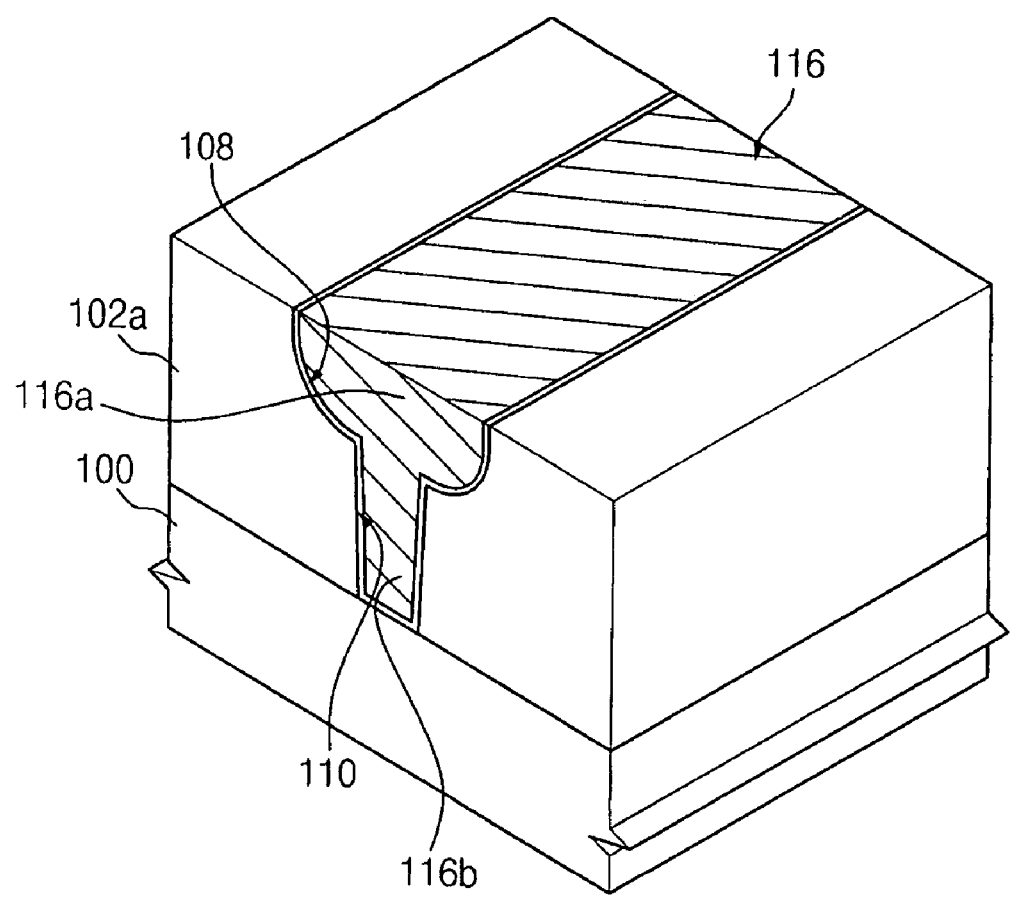

Referring to FIG. 5, the first and second trenches 108 and 110 may be filled with a conductive layer for forming the conductive layer pattern 116. Examples of a material that may be used for the conductive layer may include, e.g., a metal, a semiconductor material doped with impurities, etc.

In some embodiments of the invention, a titanium layer (not shown) and a titanium nitride layer (not shown) may be sequentially formed in the first and second trenches 108, 110. More particularly, e.g., a titanium layer and a titanium nitride layer may be sequentially formed on sidewalls of the first and second trenches 108 and 110, an upper surface of the semiconductor substrate 100, and an upper surface of the insulation interlayer 102a. The first and second trenches 108 and 110 may then filled with a tungsten layer (not shown) to form the conductive layer.

The conductive layer may then be partially removed by, e.g., a chemical mechanical polishing (CMP) process until an upper surface of the insulation interlayer 102a is exposed and the conductive layer pattern 116 is formed in the first and second trenches 108 and 110. As a result, in some embodiments of the invention, an upper surface of the conductive layer pattern 116 may extend along substantially a same plane as the upper surface of the insulation interlayer 102a.

As discussed above, because the conductive layer pattern 116 may be formed in the first and second trenches 108 and 110, the conductive layer pattern 116 may have a sidewall profile corresponding to that of sidewalls of the first and second trenches 108 and 110, i.e., the sidewall profile of the conductive layer pattern 116 may be substantially the same as a sidewall profile of a combination of the sidewalls of the first and second trenches 108, 110. Thus, the upper width of the upper portion 116a of the conductive layer pattern 116 may be wider than the lower width of the lower portion 116b of conductive layer pattern 116. The conductive layer pattern 116 may have a substantially linear shape extending in the first direction. Thus, the conductive layer pattern 116 may include the upper portion 116a having the upper width and the lower portion 116b having the lower width, and the lower width of the conductive layer pattern 116 may be narrower than the upper width of the conductive layer pattern 116.

An upper insulation interlayer (not shown) may be formed on the insulation interlayer 102a and the conductive layer pattern 116. Such an upper insulation interlayer may be partially etched by, e.g., a photolithography process to form a contact hole (not shown) exposing the upper surface of the conductive layer pattern 116.

By providing the conductive layer pattern 116 including the upper width wider than the lower width, an alignment margin of, e.g., the contact hole with the conductive layer pattern 116 may be increased, and thus, alignment error may be reduced.

The contact hole may be filled, e.g., completely filled, with a conductive material to form a contact plug (not shown) electrically connected to the conductive layer pattern 116. As a result of the wider upper portion 116a of the conductive layer pattern 116, the conductive layer pattern 116 may be accurately exposed through the contact hole and may reduce and/or avoid failed contacts between the conductive layer pattern 116 and the contact plug formed thereon. As shown in FIG. 5, e.g., the conductive layer pattern 116 may contact all or substantially all of the upper surface of the semiconductor substrate 100 exposed by the second trench 110. Embodiments of the invention are not, however, limited thereto.

In some embodiments of the invention, e.g., the first exemplary embodiment, by providing the conductive layer pattern 116 having the wider upper portion 116a, a surface area of the upper surface of upper portion 116a may be increased, and thus, a short between the contact plug on the conductive layer pattern 116 and the semiconductor substrate 100 or an adjacent pattern may be prevented.

Figure 6:
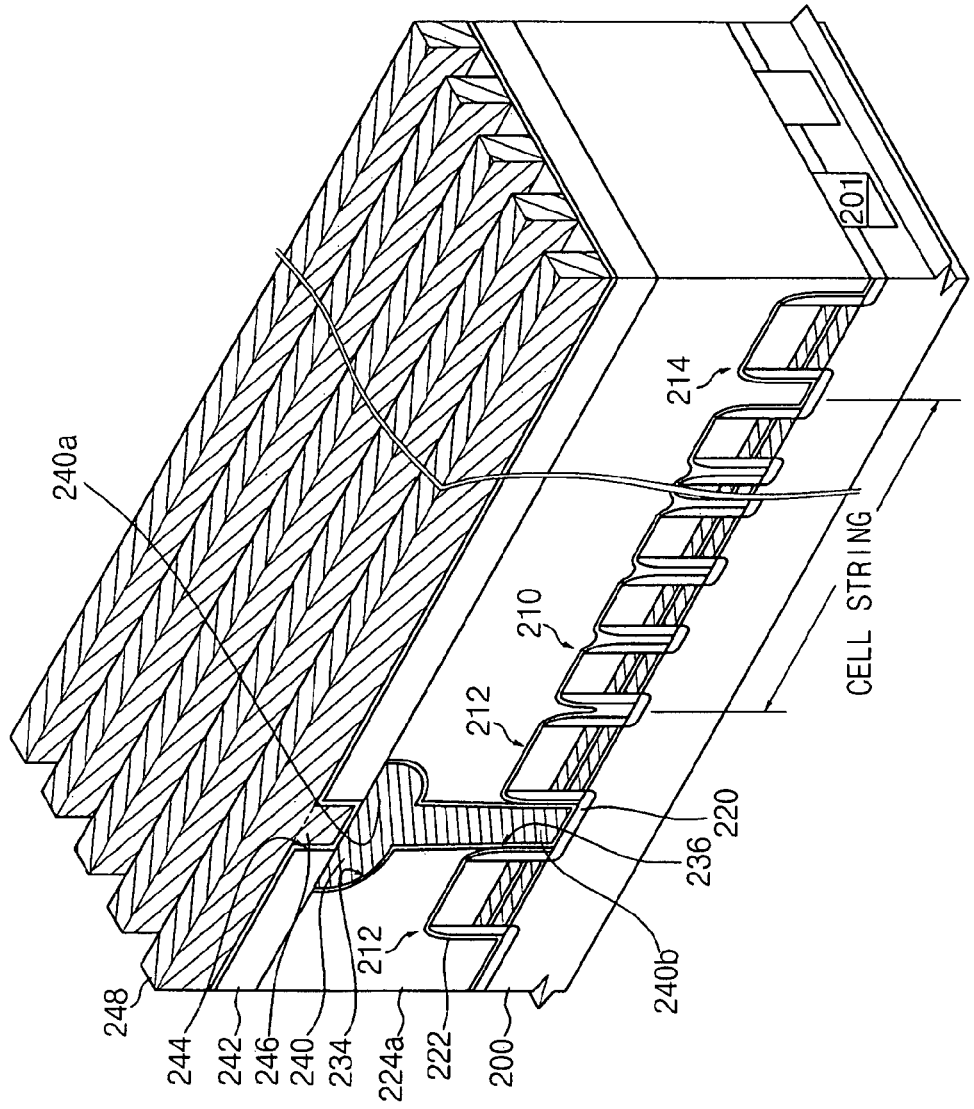
FIG. 6 illustrates a perspective view of a non-volatile memory device according to a second exemplary embodiment of the present invention.
Figure 9:
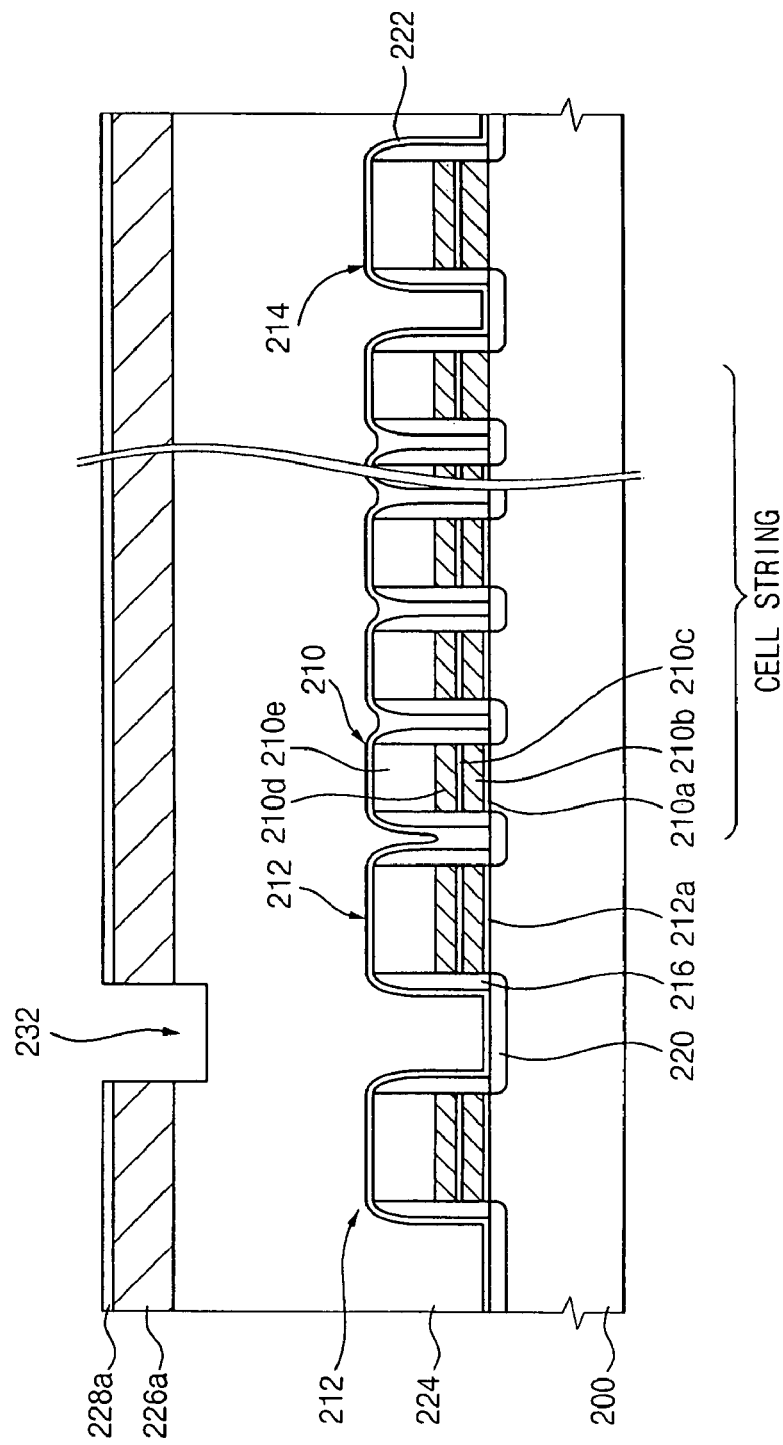
Figure 10:
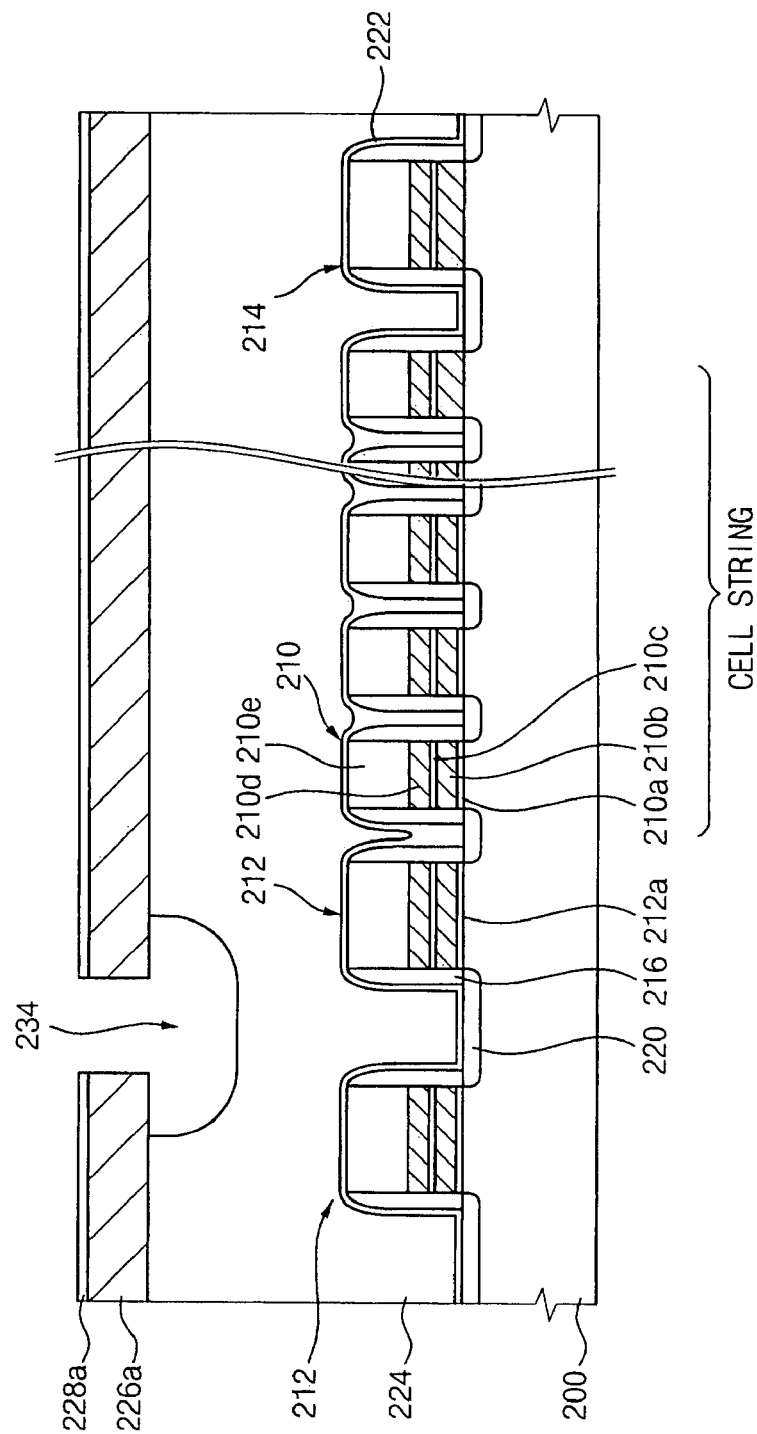
Figure 11:
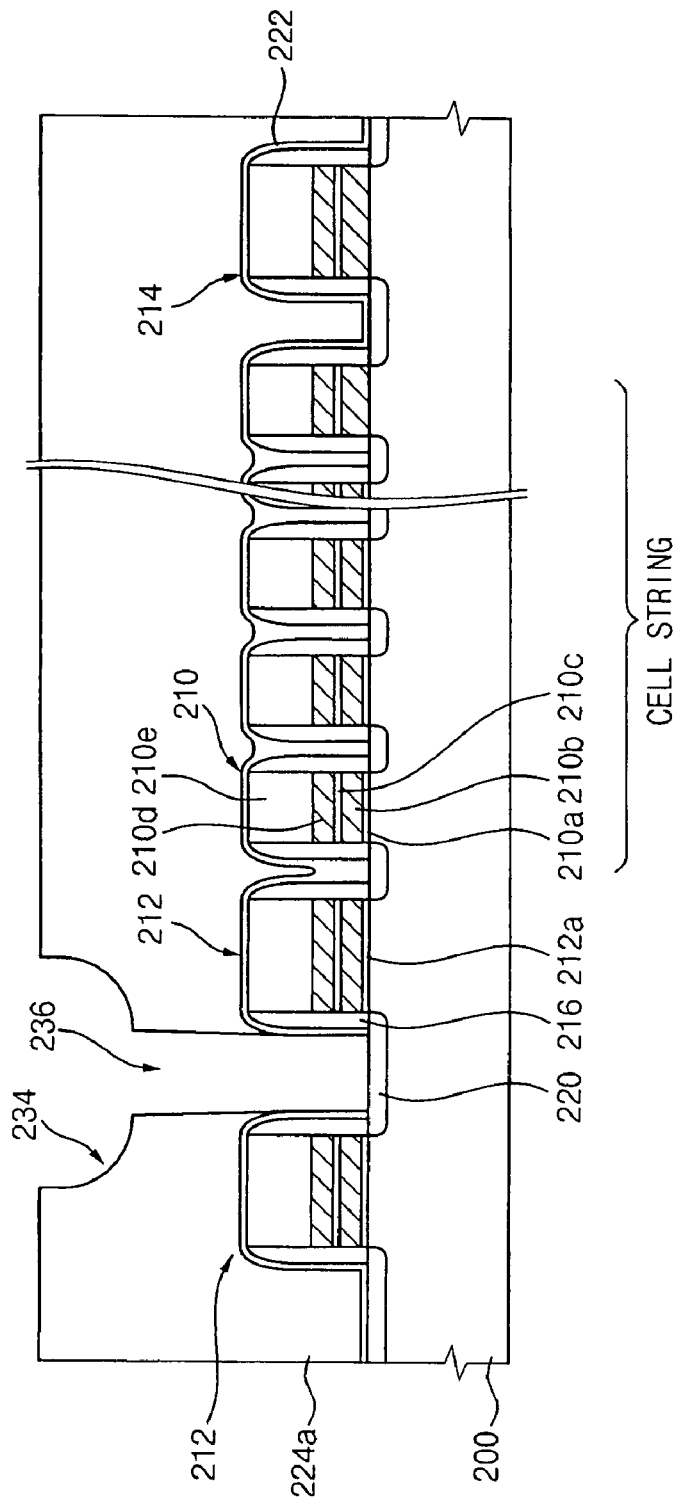
Figure 12:
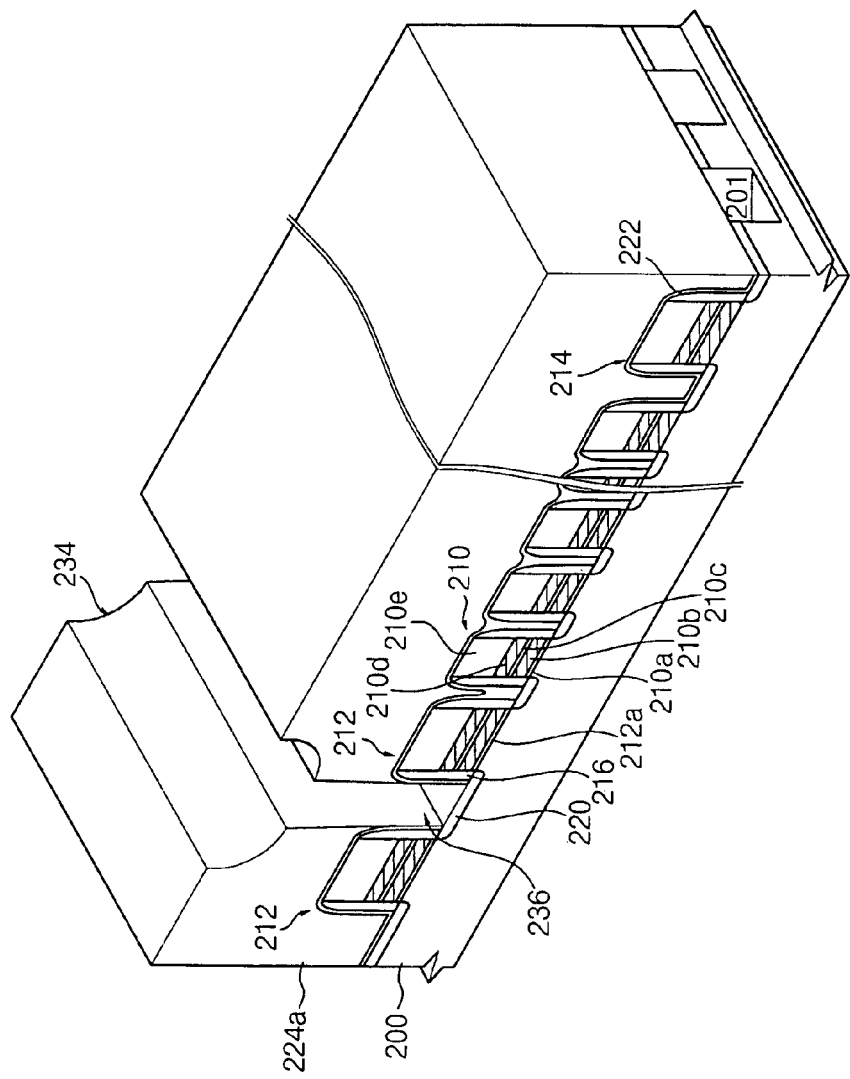
FIGS. 12 and 14 illustrate perspective of the stages shown in FIGS. 11 and 13, respectively.
Figure 13:
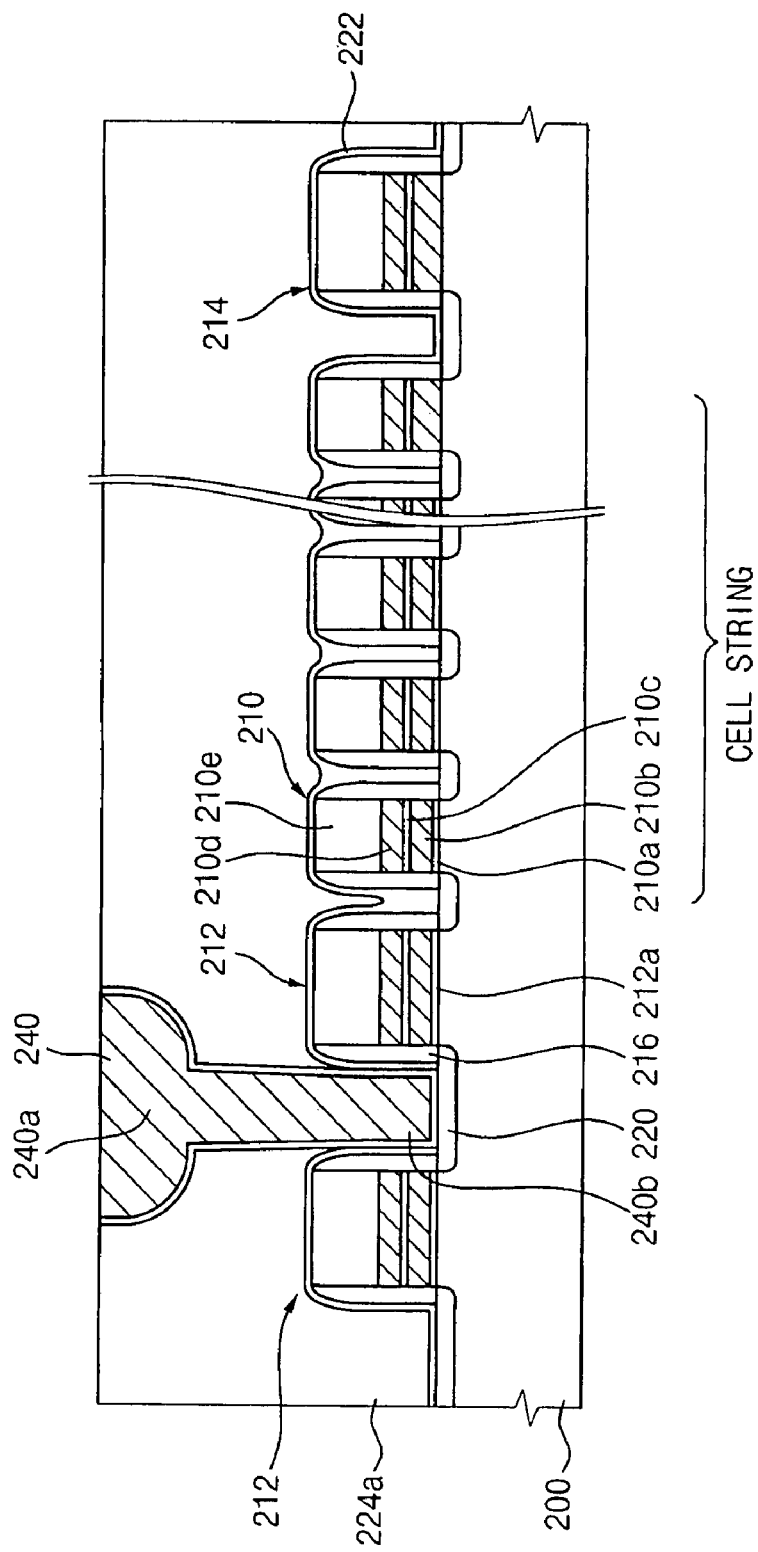
Figure 14:
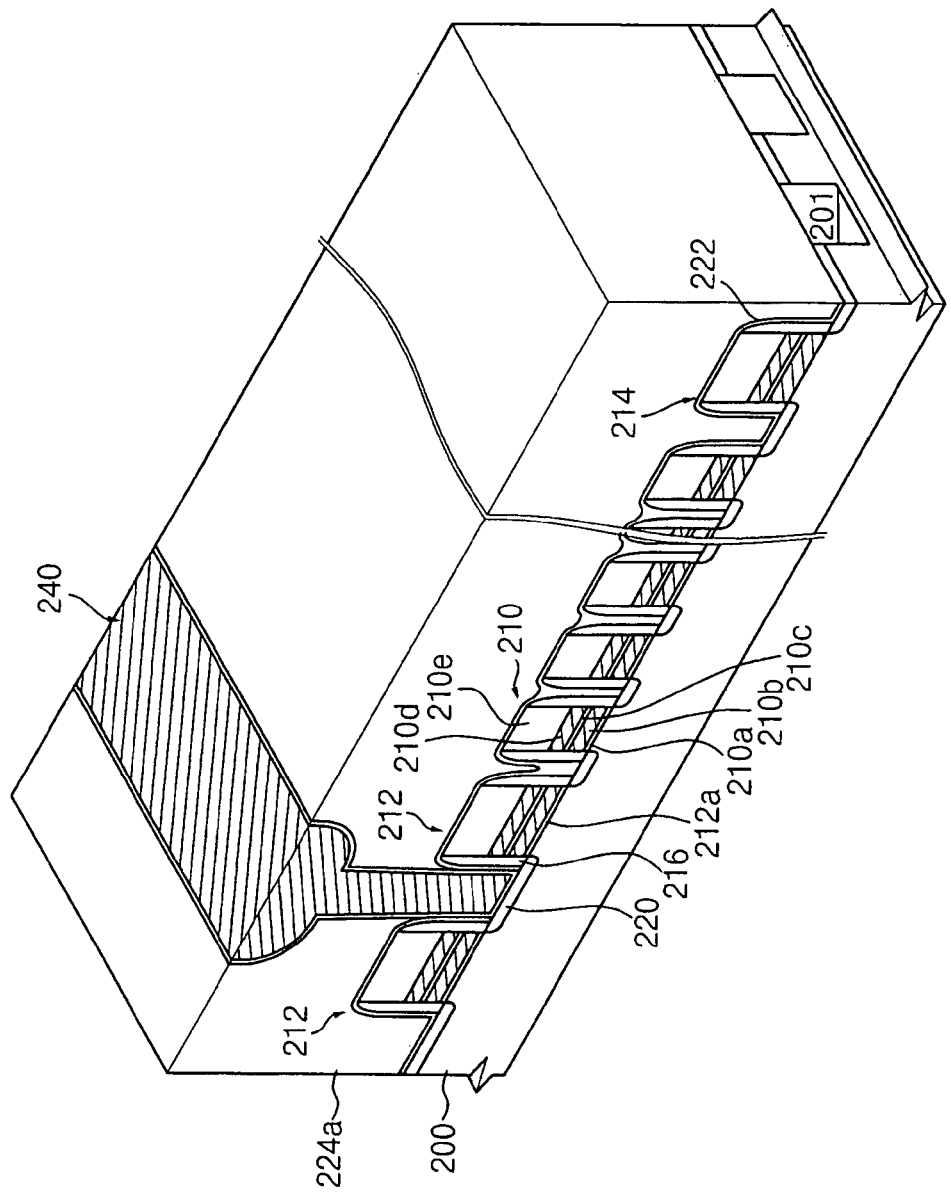

FIG. 6 illustrates a perspective view of a non-volatile memory device according to a second exemplary embodiment of the present invention, FIGS. 7 to 11, 13, 15 and 16 illustrate cross-sectional views of stages in an exemplary method of manufacturing the non-volatile memory device in FIG. 6 according to one or more aspects of the invention, and FIGS. 12 and 14 illustrate perspective of the stages shown in FIGS. 11 and 13, respectively.

Referring to FIG. 6, a cell string including cell transistors 210 extending along a first direction may be formed on a semiconductor substrate 200, e.g., a single crystalline substrate. More particularly, e.g., each of the cell strings may include, e.g., sixteen or thirty-two cell transistors 210 arranged along the first direction. The cell strings may be arranged parallel to one another along a second direction substantially perpendicular to the first direction.

Figure 7:
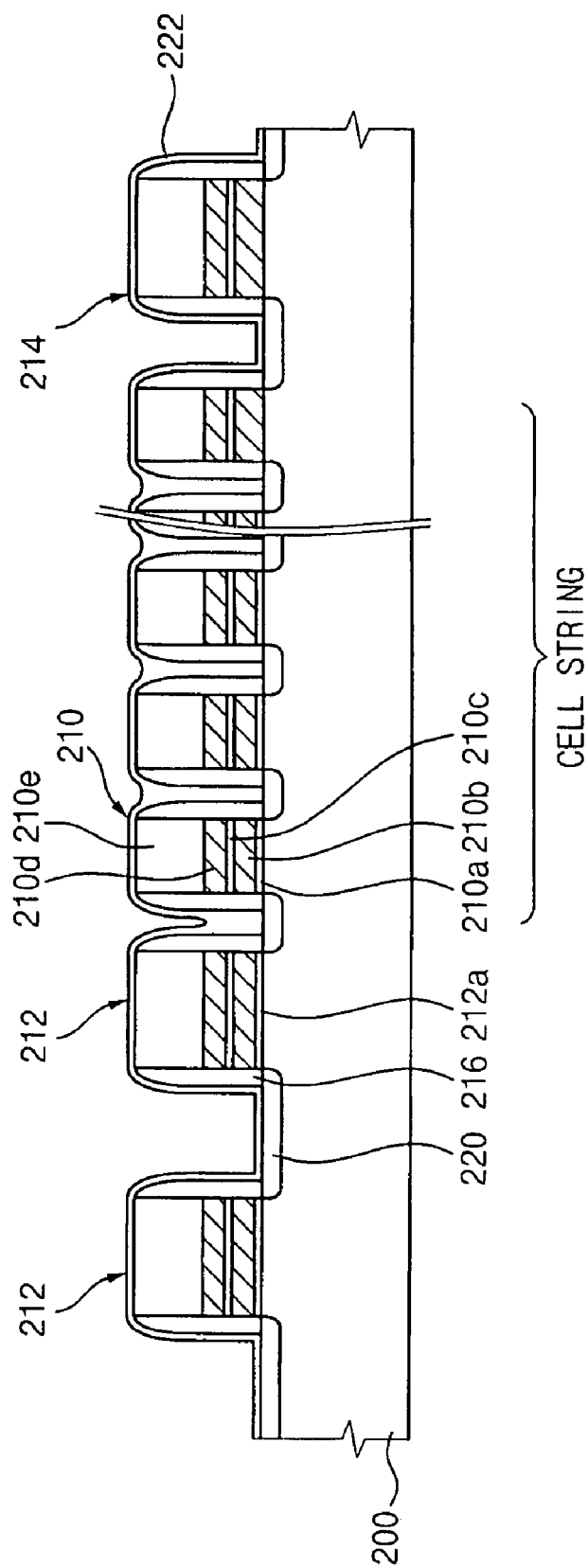
FIGS. 7 to 11, 13, 15 and 16 illustrate cross-sectional views of stages in an exemplary method of manufacturing the non-volatile memory device in FIG. 6 according to one or more aspects of the invention.

Referring to FIG. 7, the cell transistor 210 may include a gate structure that includes a tunnel oxide layer pattern 210a, a floating gate electrode 210b, a dielectric layer pattern 210c and a control gate electrode 210d that are sequentially stacked. A hard mask pattern 210e may be formed on the control gate electrode 210d.

The control gate electrode 210d may have a substantially linear shape extending in the second direction. Thus, the control gate electrode 210d may serve, e.g., simultaneously serve, as a word line of the cell transistors 210 that are arranged along the second direction.

A string selection transistor 214 may be provided at a first end of the cell string. The string selection transistor 214 may include a gate structure that includes a gate oxide layer and a gate electrode that may be sequentially stacked. Thus, the string selection transistor 214 may have functions that are substantially the same as those of a typical MOS transistor.

Further, a ground selection transistor 212 may be provided at a second end of the cell string opposite to the first end where the string selection transistor 214 may be arranged. The ground selection transistor 212 may include a gate structure that includes a gate oxide layer and a gate electrode that may be sequentially stacked. Thus, the ground selection transistor 212 may have functions that are substantially the same as those of a typical MOS transistor.

In some embodiments of the invention, e.g., the second exemplary embodiment, the string selection transistor 214 and the ground selection transistor 212 may have a gate structure that is substantially the same as that of the cell transistor 210. Thus, each of the gate structures in the string selection transistor 214 and the ground selection transistor 212 may include a tunnel oxide layer pattern, a floating gate electrode, a dielectric layer pattern and a control gate pattern, which are sequentially stacked. Further, the floating gate electrode and the control gate electrode may be connected to each other through a contact (not shown).

The control gate electrode of the string selection transistor 214 may serve as a string selection line. The control gate electrode of the ground selection transistor 212 may serve as a ground selection line.

The control gate electrode used as the ground selection line may include a first control gate electrode and a second gate electrode arranged in parallel with each other. The first control gate electrode may function as a gate of the ground selection transistor 212 connected to a first cell string. The second control gate electrode may function as a gate of the ground selection transistor 212 connected to a second cell string adjacent to the first cell string. A common source region 220 may be arranged between the gate structures of the two adjacent ground selection transistors 212, e.g. between the control gate electrodes of the two adjacent ground selection transistors 212.

A spacer 216 may be formed on a sidewall of the gate structure of each of the transistors 210, 212, 214. An etch stop layer 222 may be formed on the spacer 216 and the semiconductor substrate 200.

Referring to FIG. 6, a first insulation interlayer 224a may be formed on the semiconductor substrate 200 to cover the cell string(s), the string selection transistor(s) 214 and the ground selection transistor(s) 212. A substantially linear trench structure may be formed through the first insulation interlayer 224a. An upper surface of the semiconductor substrate 200 corresponding to the common source region 220 at one side of the ground selection transistor(s) 212 may be exposed through the trench structure. The trench structure may extend along the second direction.

The trench structure may include a first trench 234 and a second trench 236. The second trench 236 may be in communication with a lower portion of the first trench 234. More particularly, the first trench 234 may have a substantially U-like shape and a base of the U-like shape may be in communication with the second trench 236. Further, the first trench 234 may have a first width. The second trench 236 may have a second width, and the second width may be narrower than the first width.

More particularly, the trench 234 may have an upper portion having a first upper width and a lower portion having a first lower width, and the first lower width may be narrower than the first upper width. More particularly, e.g., at least the lower portion of the first trench 236 may have curved sides, e.g., rounded sides, and thus, at least the first lower width of the first trench 234 may gradually decrease toward the second trench 236.

The trench structure including the first and second trenches 234, 236 may be filled with a first conductive material to form a common source line 240. The common source line 240 may contact the common source region 220 extending in the second direction. Further, since the common source line 240 may have a sidewall profile that is substantially the same as profiles of sidewalls of the first and second trenches 234 and 236, the common source line 240 may have an upper portion 240a having an upper width and a lower portion 240b having a lower width that is narrower than the upper width.

Examples of the first conductive material that may be used for the common source line 240 may include, e.g., a metal, a semiconductor material doped with impurities, etc. In some embodiments, the common source line 240 may have low resistance, and may include, e.g., metal. More particularly, the common source line 240 may include, e.g., a barrier metal layer including a titanium/titanium nitride layer, and a tungsten layer stacked on the barrier metal layer.

A second insulation interlayer 242 may be formed on the first insulation interlayer 224a and the common source line 240. A contact hole 244 may be formed through the second insulation interlayer 242 to partially expose an upper surface of the common source line 240.

The contact hole 244 may be filled with a second conductive material to form a contact plug 246. Examples of the second conductive material that may be used for the contact plug 246 may include a metal, a semiconductor material doped with impurities, etc. In embodiments of the invention in which the contact plug 246 may be a low resistance structure, the second conductive material may include, e.g., metal. More particularly, the contact plug 246 may include, e.g., a barrier metal layer including a titanium/titanium nitride layer, and a tungsten layer stacked on the barrier metal layer.

A bit line 248 may be formed on the contact plug 246 and the second insulation interlayer 242. Thus, the bit line 248 may be electrically connected to the contact plug 246.

An exemplary method of forming the exemplary non-volatile memory device shown in FIG. 6 will be described below with reference to FIGS. 7 through 16.

An isolation layer pattern 201 may be formed in the semiconductor substrate 200 to define an active region and a field region of the semiconductor substrate 200. The isolation layer pattern 201 may have a substantially linear shape and may extend along the first direction.

As shown in FIGS. 6 and 7, the cell transistor(s) 210, the string selection transistor(s) 214 and the ground selection transistor(s) 212 may be formed on the semiconductor substrate 200.

The cell transistor(s) 210 may have a gate structure including, e.g., the tunnel oxide layer pattern 210a, the floating gate electrode 210b, the dielectric layer pattern 210c, the control gate electrode 210d and the hard mask pattern 210e. The semiconductor substrate 200 at both sides of the gate structure may be doped with impurities. The control gate electrode(s) 210d may extend in the second direction.

The cell transistors, e.g., the sixteen or thirty-two cell transistors, of each cell string may be connected to each other along the first direction.

The isolation layer pattern 201 (shown in FIG. 6), the cell transistor 210, the string selection transistor 214 and the ground selection transistor 212 may be formed in various manners. Exemplary processes for forming the isolation layer pattern 201 and the transistors will be described below.

A tunnel oxide layer (not shown), a floating gate layer (not shown) and a mask pattern (not shown) may be sequentially formed on the semiconductor substrate 200. The mask pattern may have a substantially linear shape extending in the first direction. The floating gate layer and the tunnel oxide layer may be etched using the mask pattern as an etching mask to form the tunnel oxide layer pattern 210a and a preliminary floating gate electrode (not shown).

At least a portion of the semiconductor substrate 200 exposed through the mask pattern may be etched to form an isolation trench. The isolation trench may be filled with an insulation material to form the isolation layer pattern 201. The mask pattern may then be removed. A dielectric layer (not shown), a control gate layer (not shown) and the hard mask pattern 210e may then be sequentially formed on the preliminary floating gate electrode and the isolation layer pattern 201. The hard mask pattern 210e may have a substantially linear shape extending in the second direction.

The control gate layer, the dielectric layer and the preliminary gate electrode may then be etched using the hard mask pattern 210e as an etching mask to form the gate structure.

A silicon nitride layer or a silicon oxide layer (not shown) may be formed on the sidewall of the gate structure and an upper surface of the semiconductor substrate 200. The silicon nitride layer or the silicon oxide layer may be anisotropically etched to form the spacer(s) 216 on the sidewall(s) of the gate structure.

Impurities may be implanted into the semiconductor substrate 200 adjacent to the spacer 216 to form impurity regions in the semiconductor substrate 200 between the gate structures.

After the above-mentioned processes are carried out, the cell transistor(s) 210 may be complete. The control gate electrode of the cell transistor 210 may serve as a word line.

As mentioned above, the single cell string may include, e.g., the sixteen or thirty-two cell transistors connected to each other in the first direction. As described below, the gate structures at both ends of each of the cell strings may serve as gate electrodes of the corresponding string selection transistor 214 and the corresponding ground selection transistor 212, respectively.

Hereinafter, the gate structure used as the gate electrode of the cell transistor 210 is referred to as a first gate structure, the gate structure used as the gate electrode of the string selection transistor 214 is referred to as a second gate structure, and the gate structure used as the gate electrode of the ground selection transistor 212 is referred to as a third gate structure.

The control gate electrode in the string selection transistor 214 may be used as a string selection line. The control gate electrode in the ground selection transistor 212 may be used as a ground selection line.

In some embodiments of the invention, e.g., the exemplary embodiment shown in FIG. 7, the ground selection transistor 212 may include, e.g., two transistors arranged in parallel with each other. Thus, the third gate structures of the ground selection transistors 212 may have substantially linear shapes arranged parallel with each other. The common source region 220 may be between the third gate structures.

The etch stop layer 222 including, e.g., silicon nitride may be formed on the semiconductor substrate 200, the spacer 216 and the first to third gate structures.

Figure 8:
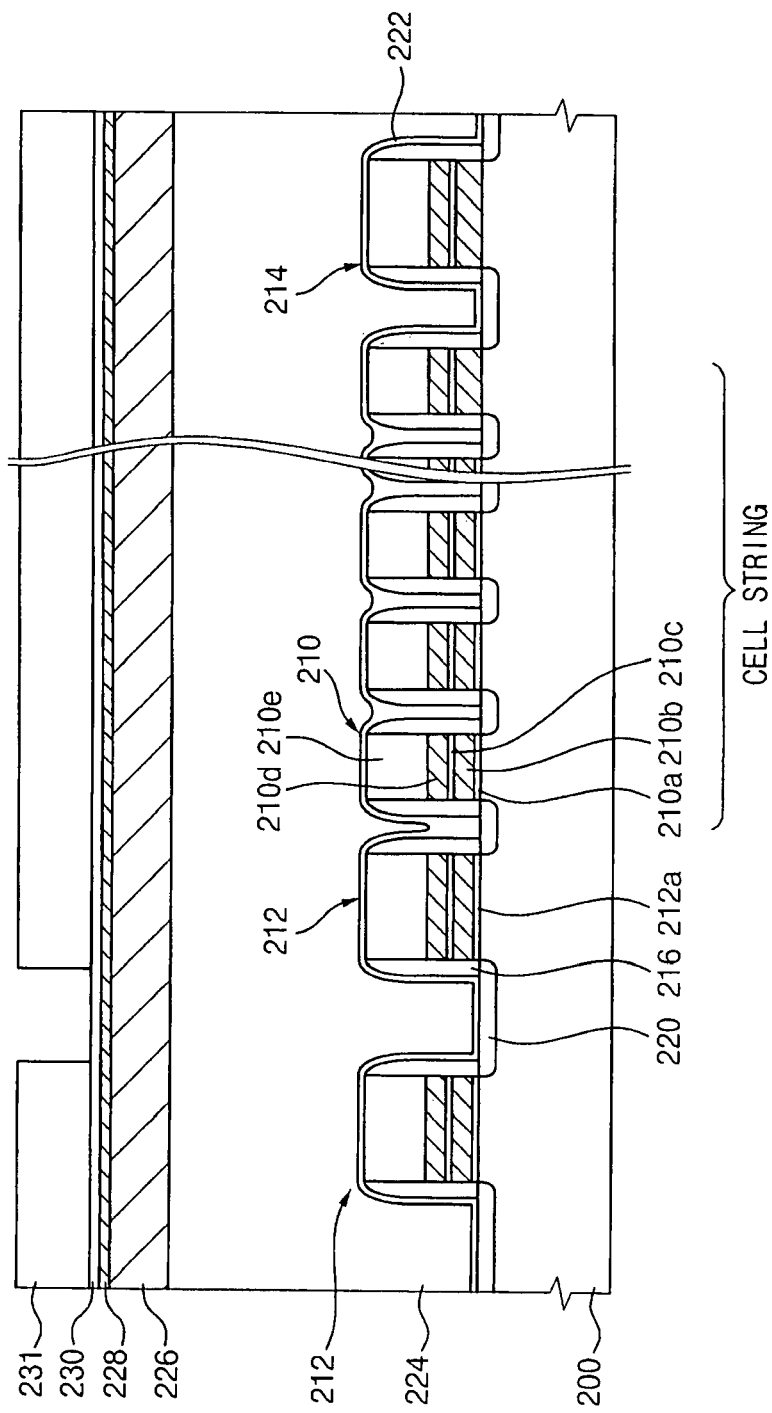

Referring to FIG. 8, a preliminary first insulation interlayer 224 may be formed on the etch stop layer 222 to cover the gate structures. The preliminary first insulation interlayer 224 may include, e.g., a silicon oxide layer formed by an HDP-CVD process, a BPSG layer formed by a high-pressure CVD (HP-CVD) process, etc.

An amorphous carbon layer 226 may be formed on the preliminary first insulation interlayer 224. The amorphous carbon layer 226 may be used as a hard mask for etching the preliminary first insulation interlayer 224. The amorphous carbon layer 226 may be formed, e.g., by a CVD process.

A silicon oxynitride layer 228 may be formed on the amorphous carbon layer 226 to protect the amorphous carbon layer 226. The silicon oxynitride layer 228 may also be used as an anti-reflective layer.

An organic anti-reflective layer 230 may be formed on the silicon oxynitride layer 228. The organic anti-reflective layer 230 may prevent light from being diffused in a plurality of directions during an exposure process. The organic anti-reflective layer 228 may be removed by, e.g., an ashing process.

A photoresist film (not shown) may be formed on the organic anti-reflective layer 230. The photoresist film may then exposed and developed to form a photoresist pattern 231. The exposure process may use, e.g., a KrF light source, an ArF light source, an I-line light source, etc.

A portion of the organic anti-reflective layer 230 exposed through the photoresist pattern 231 may have a substantially linear shape extending in the second direction and may substantially overlap the common source region 220.

Referring to FIG. 9, the organic anti-reflective layer 230, the silicon oxynitride layer 228 and the amorphous carbon layer 226 may be etched using the photoresist pattern 231 as an etching mask to form a first mask pattern. The first mask pattern may be used for forming a trench through the preliminary first insulation interlayer 224.

When the organic anti-reflective layer 230, the silicon oxynitride layer 228 and the amorphous carbon layer 226 are etched, the photoresist pattern 231 and the organic anti-reflective layer 230 may be completely and/or substantially completely removed. Therefore, the first mask pattern may include an amorphous carbon layer pattern 226a and a silicon oxynitride layer pattern 228a.

The preliminary first insulation interlayer 224 may then be anisotropically etched using the first mask pattern as an etching mask to form a preliminary first trench 232. The preliminary first trench 232 may have a bottom surface higher than an upper surface of the third gate structure, i.e., the bottom surface of the preliminary first trench 232 may be further from the semiconductor substrate 200 than the upper surface of the third gate structure.

Further, while the preliminary first insulation interlayer 224 is anisotropically etched, the silicon oxynitride layer pattern 228a may be partially removed.

Referring to FIG. 10, a portion of the preliminary first insulation interlayer 224, e.g., an exposed portion of the preliminary first insulation layer 224 corresponding to a sidewall and a bottom surface of the preliminary first trench 232, may be isotropically etched to form the first trench 234 having the first width that is wider than that of a width of the preliminary first trench 232. The isotropic etching process may include, e.g., a wet etching process, a dry etching process using chemical(s), etc.

Further, during the isotropic etching process, in some cases if an etched thickness of the preliminary first insulation interlayer 224 while forming the first trench 234 is less than about 100 Å, the first width of the first trench 234, and more particularly, an area defined by upper edge portions of the preliminary first insulation interlayer 224 defining the first trench 234, may not be larger than a width and/or surface area of upper surface of the common source region 220, and thus, a contact margin may be too small and/or may not be increased so as to ensure sufficient contact between the common source line 240 that may be on the common source region 220 and any contact plug formed on the common source line 240. In contrast, when an etched thickness of the preliminary first insulation interlayer 224 while forming the first trench 234 is more than about 1,000 Å, the first width of the first trench 234 may be too wide and the first trench 234 may not be filled, e.g., fully filled, with a conductive material. As a result, voids may be generated in the common source line 240 that may be formed thereon. Thus, in some embodiments of the invention, an etched thickness of the preliminary first insulation interlayer 224 while forming the first trench 234 may be about 100 Å to about 1,000 Å.

Referring to FIGS. 11 and 12, a portion of the preliminary first insulation interlayer 224, e.g., an exposed portion of the preliminary first insulation layer 224 corresponding to a bottom surface of the first trench 234, and the etch stop layer 222 may then be anisotropically etched using the first mask pattern as an etching mask to form the second trench 236 exposing the semiconductor substrate 200. After the anisotropic etching process is performed, formation of the insulation interlayer 224a having the first and second trenches 234 and 236 may be complete.

More particularly, in some embodiments of the invention, the preliminary first insulation interlayer 224 may be etched by, e.g., a dry etching process to expose the etch stop layer 222. In other embodiments of the invention, e.g., the preliminary first insulation interlayer 224 may be etched using an end point detection (EPD) manner to expose the etch stop layer 222. The exposed etch stop layer 222 may then be etched to form the second trench 236 exposing the semiconductor substrate 200.

The second trench 236 may have the second width, which may be substantially the same as or narrower than a width of the gap in the first mask pattern or a width of a gap between adjacent first mask patterns. As a result, the second width of the second trench 236 may be narrower than the first width of the first trench 234.

During etching of the preliminary first insulation interlayer 224 and the etch stop layer 222, the silicon oxynitride layer pattern 228a and the amorphous carbon layer pattern 226a may be partially removed. After forming the second trench 236, the silicon oxynitride layer pattern 228a and the amorphous carbon layer pattern 226a or any remaining portion of the silicon oxynitride layer pattern 228 and the amorphous carbon layer pattern 226a may then be removed by, e.g., an ashing process and/or an organic stripping process.

Referring to FIGS. 13 and 14, the first and second trenches 234 and 236 may be filled with a first conductive layer to form the common source line 240. The first conductive material may include, e.g., a metal.

In some embodiments, a titanium layer (not shown) and a titanium nitride layer (not shown) as a first barrier metal layer may be sequentially formed on sidewalls of the first and second trenches 234 and 236, an upper surface of the semiconductor common source region 220 and an upper surface of the first insulation interlayer 224a. In some embodiments of the invention, the titanium layer may have a thickness of about 60 Å to about 100 Å, and the titanium nitride layer may have a thickness of about 50 Å to about 200 Å. In some embodiments of the invention, the titanium layer and the titanium nitride layer may be formed by, e.g., a CVD process, a physical vapor deposition (PVD) process, etc.

A first tungsten layer may be formed on the titanium nitride layer to fill, e.g., fully fill, the first and second trenches 234 and 236. The first tungsten may be formed by, e.g., a CVD process, PVD process, etc.

A portion of the first tungsten layer may then be removed by, e.g., a CMP process until the upper surface of the first insulation interlayer 224a is exposed to form the common source line 240. The upper width of the upper portion 240a of the common source line 240 may be wider than the lower width of the lower portion 240b of the common source line 240.

Figure 15:
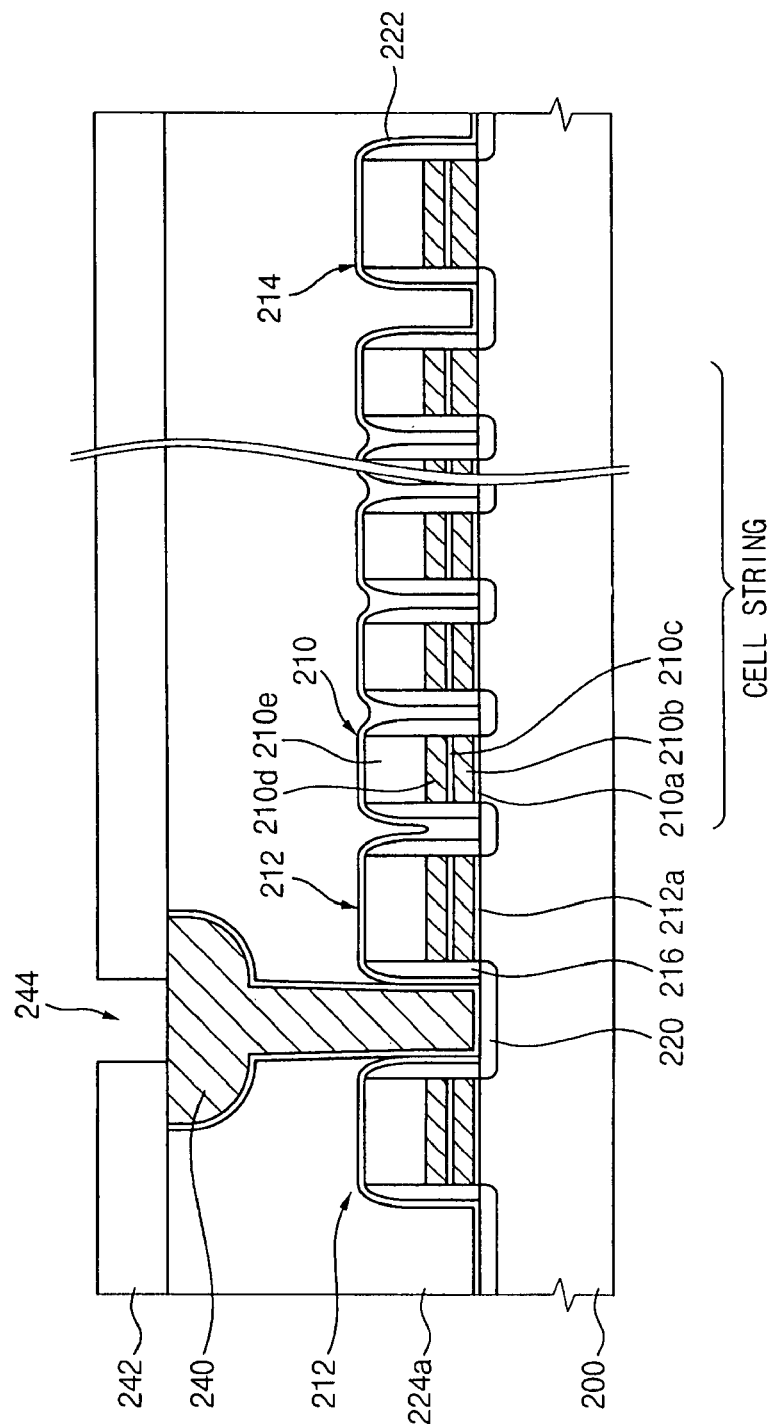

Referring to FIG. 15, a second upper insulation interlayer (not shown) may be formed on the first insulation interlayer 224a and the common source line 240.

The second insulation interlayer may then be partially etched by, e.g., a photolithography process to form a contact hole 244 exposing a portion of an upper surface of the common source line 240. The exposure process may use, e.g., a KrF light source, an ArF light source, an I-line light source, etc. After the above-mentioned processes are performed, formation of the second insulation interlayer 242 having the contact hole 244 may be complete.

Figure 16:
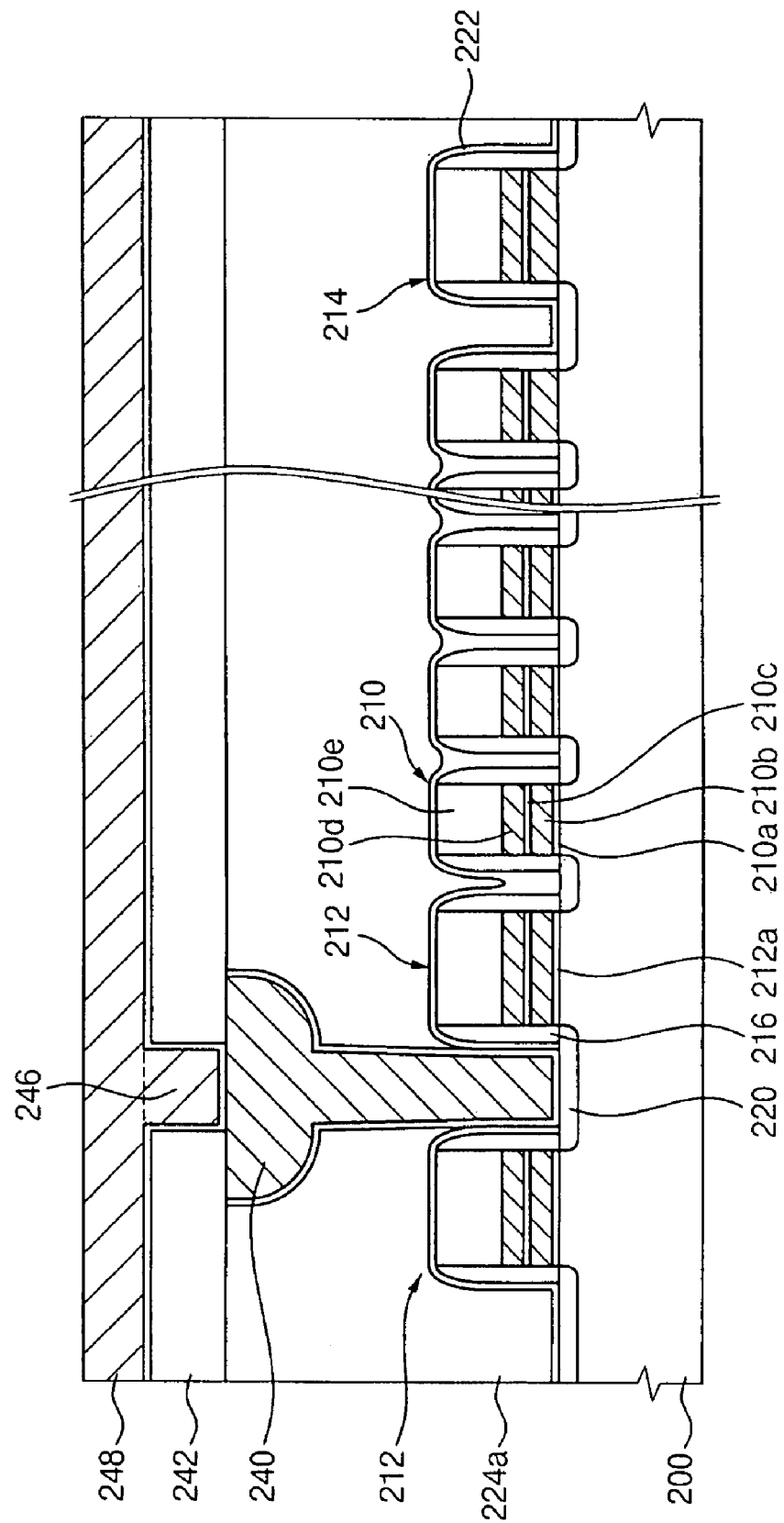

Referring to FIG. 16, the contact hole 244 may be filled with a second conductive material to form the contact plug 246. The bit line 248 may then be formed over the second insulation interlayer 242 and the contact plug 246. The bit line 248 extending in the first direction may contact with the contact plug 246.

In some embodiments of the invention, the contact plug 246 and the bit line 248 may be formed by separate processes. In other embodiments of the invention, the contact plug 246 and the bit line 248 may be simultaneously formed.

To form the contact plug 246 and the bit line 248 by separate processes, a titanium layer and a titanium nitride layer serving as a second barrier metal layer may be formed on inner surfaces of the contact hole 244 and an upper surface of the second insulation interlayer 242. A second tungsten layer may be formed on the titanium nitride layer to fill up, e.g. completely fill, the first and second trenches 234 and 236. A portion of the second tungsten layer may be removed by, e.g., a chemical mechanical polishing (CMP) process until an upper surface of the second insulation interlayer 242 is exposed to form the contact plug 246.

A third barrier metal layer and a metal layer may be sequentially formed on the contact plug 246 and the second insulation interlayer 242. The third barrier metal layer and the metal layer may be patterned to form the bit line 248. The pattering process may include, e.g., a dry etching process using a hard mask pattern (not shown) including, e.g., silicon nitride.

To simultaneously form the contact plug 246 and the bit line 248 by, e.g., a single metal deposition process, a titanium layer and a titanium nitride layer as a second barrier metal layer may be formed on the inner surfaces of the contact hole 244 and an upper surface of the second insulation interlayer 242. A second tungsten layer may be formed on the second insulation interlayer 242 to fill up, e.g., completely fill, the contact hole 244. The second tungsten layer may be patterned to simultaneously form the contact plug 246 and the bit line 248. The pattering process may include, e.g., a dry etching process using a hard mask pattern (not shown) including, e.g., silicon nitride.

In the exemplary embodiments illustrated in FIGS. 6 through 16, the common source line 240 may have a wider upper portion 240a and, more particularly, e.g., a wider upper surface, so that the contact plug 246 making contact with the common source line 240 may be readily formed and an electrical contact between the common source line 240 and the contact plug 246 may be ensured. As shown in FIG. 15, e.g., the common source line 240 may contact all or substantially all of the upper surface of the common source region 220 between the spacers 216. Embodiments of the invention are not, however, limited thereto.

Embodiments of the invention may provide a conductive layer pattern, e.g., a substantially linear conductive layer pattern, having a wider upper portion relative to a lower portion thereof. Thus, embodiments of the invention may provide a conductive layer pattern having a shape so to ensure that a short between a contact plug that may be formed on the conductive layer pattern and a semiconductor substrate or an adjacent pattern may not be generated. As a result, embodiments of the invention may provide a conductive layer pattern having a shape that may improve a yield of a semiconductor device including such a conductive pattern structure according to one or more aspects of the invention.

It will be understood that when an element or layer is referred to as being "on," "connected to," "coupled to," "between," or "under" another element or layer, unless specified otherwise, it can be directly on, connected, coupled to, between or under the other element or layer or intervening elements or layers may be present. When an element is referred to as being "directly on," "directly connected to" "directly coupled to," "directly between," or "directly under" another element or layer, there are no intervening elements or layers present. Like numbers refer to like elements throughout the specification. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a wiring structure of a semiconductor device, comprising:
    forming a preliminary insulation interlayer on a substrate;
    forming a mask pattern on the preliminary insulation interlayer, forming the mask pattern includes:
        sequentially forming an amorphous carbon layer, a buffer layer, an organic anti-reflective layer and a photoresist film on the preliminary insulation interlayer,
        patterning the photoresist film to form a photoresist pattern, and
        etching the organic anti-reflective layer, the buffer layer and the amorphous carbon layer using the photoresist pattern as an etching mask;
    anisotropically etching the preliminary insulation interlayer using the mask pattern as an etching mask to form a preliminary first trench;
    isotropically etching, with the mask pattern remaining on the preliminary insulation interlayer, the preliminary insulation interlayer exposed through the preliminary first trench to form a linear first trench having a first width;
    anisotropically etching the preliminary insulation interlayer exposed through the linear first trench using the mask pattern as an etching mask to form a linear second trench having a second width, the first width being wider than the second width; and
    filling the linear first and second trenches with a conductive layer pattern.

2. The method as claimed in claim 1, further comprising:
    forming an upper insulation interlayer on the insulation interlayer and the conductive layer pattern;
    partially etching the upper insulation interlayer to form a contact hole exposing an upper surface of the conductive layer pattern; and
    filling the contact hole with a conductive material to form a contact plug contacting the upper surface of the conductive layer pattern.

3. A method of manufacturing a non-volatile memory device, comprising:
    forming a cell string on a substrate, the cell string including cell transistors arranged in a first direction;
    forming a string selection transistor and a ground selection transistor at both ends of the cell string, respectively;
    covering the cell string, the string selection transistor and the ground selection transistor with a first insulation interlayer, the first insulation interlayer having a linear trench structure that exposes an upper surface of the substrate corresponding to a common source region at a side of the ground selection transistor and extends in a second direction substantially perpendicular to the first direction, and the linear trench structure having a first trench that has a first width and a second trench that is in communication with a lower portion of the first trench and has a second width narrower than the first width;

forming a common source line in the linear trench structure, the common source line having an upper width and a lower width narrower than the upper width;

forming a second insulation interlayer on the first insulation interlayer and the common source line, the second insulation interlayer having a contact hole that partially exposes an upper surface of the common source line; and forming a contact plug in the contact hole, wherein forming the first insulation interlayer having the linear trench structure includes:

forming a preliminary first insulation interlayer on the substrate to cover the cell string, the string selection transistor and the ground selection transistor;

forming a mask pattern on the preliminary first insulation interlayer, forming the mask pattern includes:

sequentially forming an amorphous carbon layer, a buffer layer, an organic anti-reflective layer and a photoresist film on the preliminary insulation interlayer, patterning the photoresist film to form a photoresist pattern, and etching the organic anti-reflective layer, the buffer layer and the amorphous carbon layer using the photoresist pattern as an etching mask;

anisotropically etching the preliminary first insulation interlayer using the mask pattern as an etching mask to form a preliminary first trench;

isotropically etching, with the mask pattern remaining on the preliminary first insulation interlayer, the preliminary first insulation interlayer exposed through the preliminary first insulation interlayer exposed through the preliminary first trench to form the first trench having the first width; and anisotropically etching the preliminary first insulation interlayer exposed through the first trench using the mask pattern as an etching mask to form the second trench having the second width.

4. The method as claimed in claim 3, wherein the common source line and the contact plug include a metal.

5. The method as claimed in claim 3, further comprising forming a wiring line on the second insulation interlayer and the contact plug, the wiring line being electrically connected to the contact plug.

6. The method as claimed in claim 3, wherein isotropically etching the preliminary first insulation interlayer comprises partially etching the preliminary first insulation interlayer exposed through a sidewall and a bottom surface of the preliminary first trench.

* * * * *